(12) United States Patent
Aspar et al.

(10) Patent No.: US 6,913,971 B2
(45) Date of Patent: Jul. 5, 2005

(54) LAYER TRANSFER METHODS

(75) Inventors: Bernard Aspar, Rives (FR); Séverine Bressot, La Riviere (FR); Olivier Rayssac, Grenoble (FR)

(73) Assignees: S.O.I. Tec Silicon on Insulator Technologies S.A., Bernin (FR); Commissariat à l'Energie Atomique (CEA), Paris (FR)

( * ) Notice: Subject to any disclaimer, the term of this patent is extended or adjusted under 35 U.S.C. 154(b) by 96 days.

(21) Appl. No.: 10/616,586

(22) Filed: Jul. 9, 2003

(65) Prior Publication Data

US 2004/0082147 A1 Apr. 29, 2004

(30) Foreign Application Priority Data

Jul. 17, 2002 (FR) .............................. 02 09018

(51) Int. Cl.[7] .................. H01L 21/8242; H01L 21/336
(52) U.S. Cl. ...................... 438/256; 438/258
(58) Field of Search ................ 438/455, 139, 438/770, 691, 960, 456, 458, 459

(56) References Cited

U.S. PATENT DOCUMENTS

| 5,374,564 | A | * | 12/1994 | Bruel | 438/455 |
|---|---|---|---|---|---|
| 6,100,166 | A | * | 8/2000 | Sakaguchi et al. | 438/455 |
| 6,376,332 | B1 | | 4/2002 | Yanagita et al. | 438/458 |
| 6,406,336 | B1 | | 6/2002 | Stansbury | 216/2 |
| 6,448,155 | B1 | | 9/2002 | Iwasaki et al. | 438/464 |
| 6,534,380 | B1 | * | 3/2003 | Yamauchi et al. | 438/455 |
| 6,548,338 | B2 | * | 4/2003 | Bernstein et al. | 438/210 |
| 6,673,694 | B2 | * | 1/2004 | Borenstein | 438/411 |
| 6,727,549 | B1 | * | 4/2004 | Doyle | 257/347 |
| 2002/0081822 | A1 | | 6/2002 | Yanagita et al. | 438/455 |

FOREIGN PATENT DOCUMENTS

| EP | 1 061 566 A2 | 12/2000 |
|---|---|---|
| FR | 2811807 | 1/2002 |
| WO | WO/02/05344 A1 | 1/2002 |

* cited by examiner

Primary Examiner—Craig A. Thompson
Assistant Examiner—William C. Vesperman
(74) Attorney, Agent, or Firm—Winston & Strawn LLP

(57) ABSTRACT

Methods for transferring a layer of material from a source substrate having a zone of weakness onto a support substrate to fabricate a composite substrate are described. An implementation includes forming at least one recess in at least one of the source and support substrates, depositing material onto at least one of a front face of the source substrate and a front face of the support substrate, pressing the front faces of the source and support substrates together to bond the substrates, and detaching a transfer layer from the source substrate along the zone of weakness. When the front faces are pressed together, any excess material is received by the recess. The recess may advantageously include an opening in the front face of at least one of the source substrate and the support substrate.

22 Claims, 4 Drawing Sheets

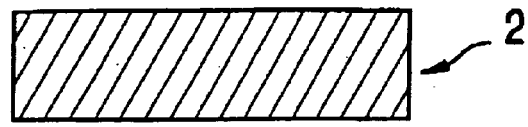
FIG_1
PRIOR ART
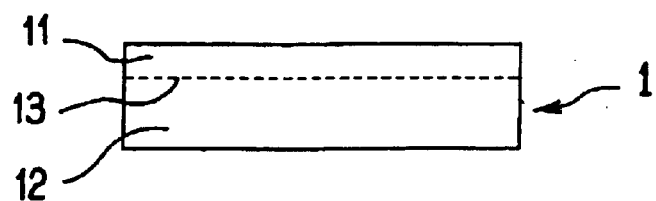
FIG_2
PRIOR ART
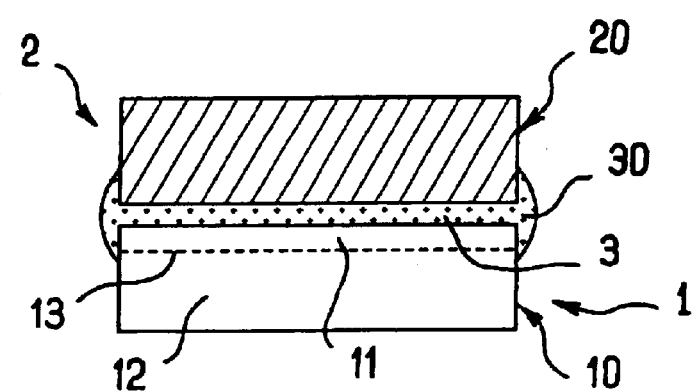
FIG_3
PRIOR ART
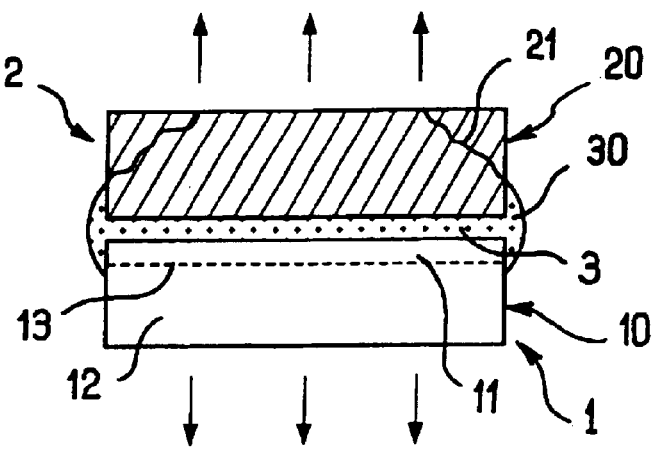

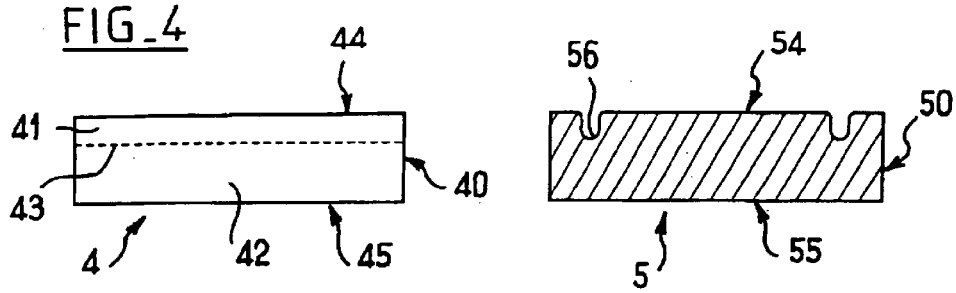
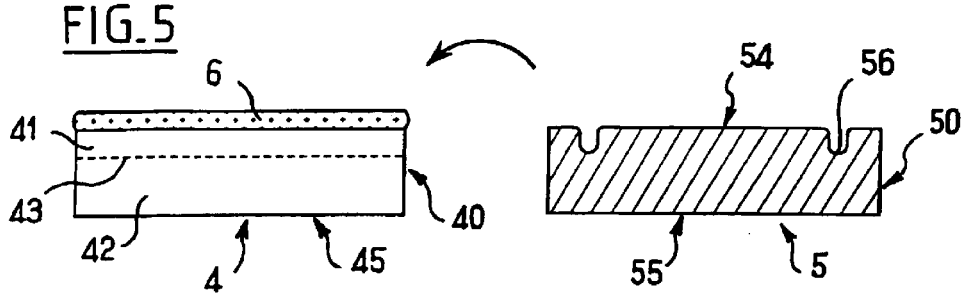
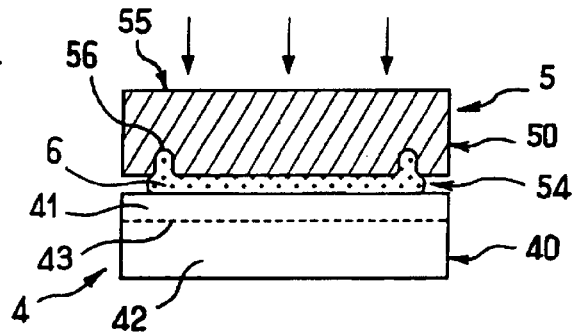
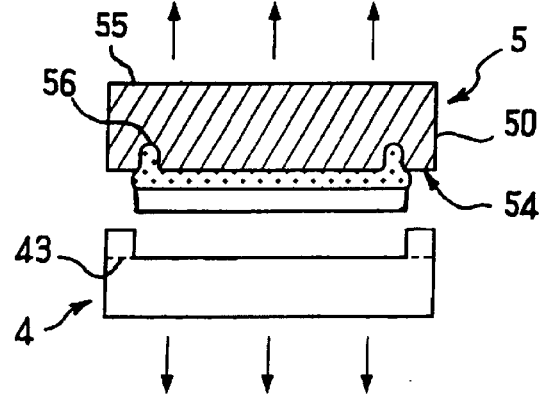

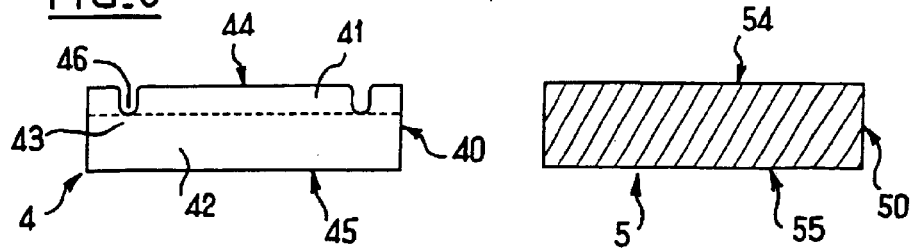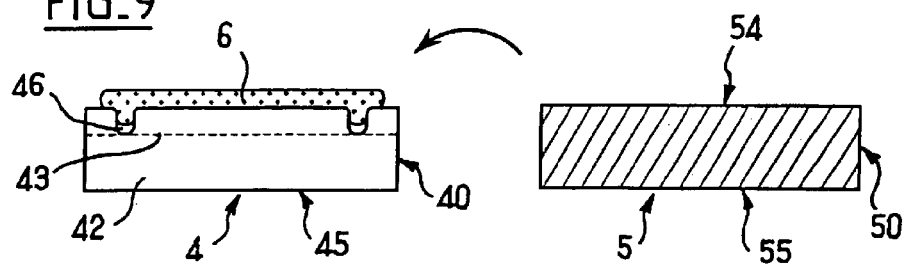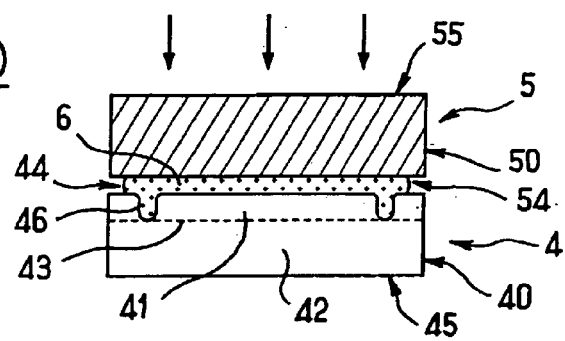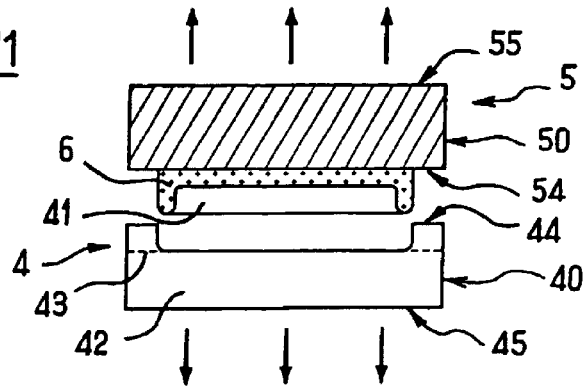

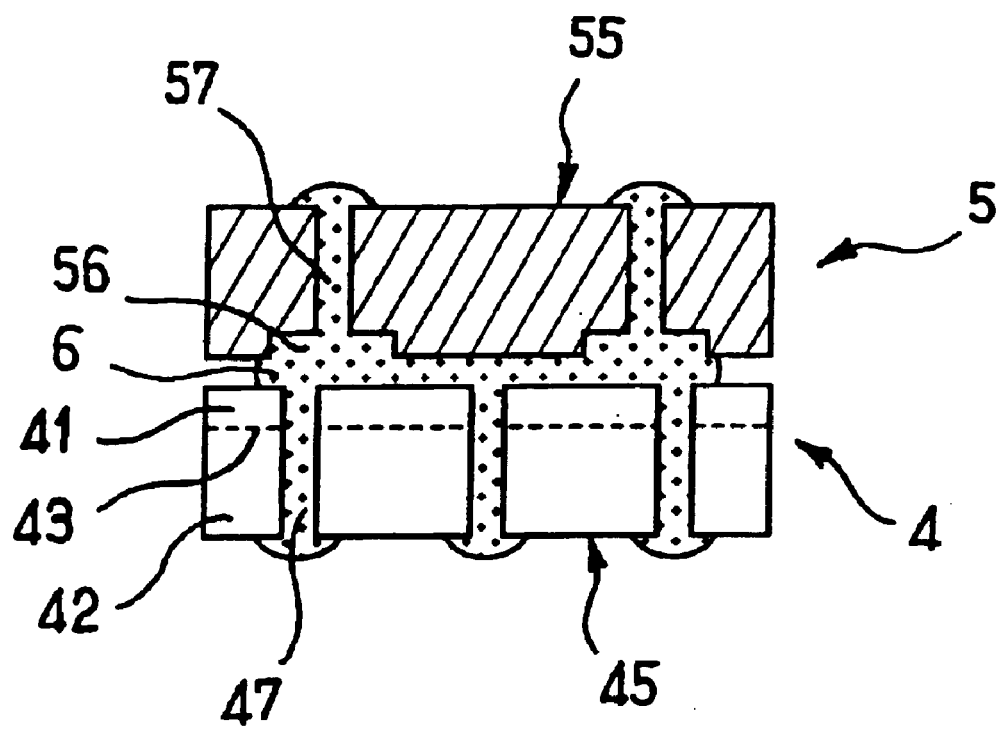
FIG_12

LAYER TRANSFER METHODS

BACKGROUND OF THE INVENTION

The present invention relates to improved methods for transferring a layer of material from a source substrate onto a support substrate during the fabrication of composite substrates, in particular for optics, optoelectronics, or electronics.

Novel techniques have recently been developed for transferring a layer of a material, such as a processed layer of semiconductor material, from a first or "source" substrate onto a second or "support" substrate. The term "processed layer" means a layer of material that has undergone some or all of the steps of a technique for forming electronic components. Transfer techniques may use a source substrate that has a weakened zone that was formed by implanting atomic species, or a substrate having a buried porous zone, or a substrate with two layers that have been bonded to each other at a bonding interface by using a controlled bonding energy. Such techniques are described briefly below with reference to FIGS. 1 to 3.

In FIG. 1, the source substrate 1 includes a weakened zone formed by using one of the techniques mentioned above. The source substrate is brought into contact with a support substrate 2 to form a stack. The layer to be transferred 11 is then detached from the remainder 12 of the source substrate along a zone of weakness 13 of the substrate. The layer 11 may be detached by introducing mechanical stresses, such as tension and/or bending and/or shear stresses. The mechanical stresses can be applied, for example, by a pulling rig, by a cutting blade applied to the side of the stack at the zone of weakness 13, or by a jet of fluid or liquid, or gas applied laterally to the zone of weakness. The mechanical stresses encourage the propagation of a crack along the zone of weakness 13.

The two substrates 1 and 2 could be connected to each other by molecular bonding, without using an adhesive or an adhesive film. Transfer of the layer 11 is possible if the mechanical retention of layer 11 of the source substrate 1 is well below the mechanical retention of the layer 11 of the support substrate 2. However, that condition may no longer be satisfied if adhesive is used since the exact volume of deposited adhesive is difficult to control. As can be seen in FIG. 2, the adhesive 3 very often projects outwardly 30 beyond the respective side faces 10, 20 (or sides) of substrates 1, 2 to cover or mask the periphery of the zone of weakness 13. It is very difficult to properly detach the layer 11 from the substrate 1 by applying mechanical stresses when the periphery of the zone of weakness 13 is covered. In particular, the mechanical force required to detach the layer 11 is very high, and as shown in FIG. 3, could result in a fracture of the substrates and in particular of the support substrate 2 along fracture lines 21. The fracture lines may not extend in the plane of the zone of weakness 13, but can occur in a random and unpredictable manner throughout the thickness of the substrate 2.

It would be beneficial to provide a technique that overcomes the disadvantages described above to improve mechanical transfer methods. In addition, it would be advantageous to provide a method that prevents excess material at a bonding interface from covering the peripheral edge of the zone of weakness. The present invention now provides such methods.

SUMMARY OF THE INVENTION

The methods according to the present invention overcome the disadvantages described above. In particular, described herein are improved layer transfer methods that prevent excess material deposited at a bonding interface between a source substrate and a support substrate from covering the peripheral edge of the zone of weakness.

The invention generally relates to a method for fabricating a composite substrate which comprises forming a recess in a front face of at least one of a support substrate or a source substrate that includes a zone of weakness, the recess having a configuration that, in conjunction with the zone of weakness, assists in defining a transfer layer in the source substrate; depositing a bonding material onto at least one of the front face of the source substrate or the front face of the support substrate; bonding the front faces of the source and support substrates together in a manner to provide at least some of the bonding material in the recess; and detaching the transfer layer from the source substrate along the zone of weakness to form a composite substrate comprising the transfer layer, bonding material and the support substrate.

Advantageously, the transfer layer has a periphery and the configuration of the recess corresponds to the periphery of the transfer layer. In a preferred arrangement, the transfer layer periphery and recess are circular. Also, the recess preferably comprises a groove or channel. A preferred bonding material is at least one of an adhesive or an adhesive material.

In one embodiment, the recess is formed in the front face of the support substrate, the bonding material is deposited onto the front face of the source substrate as a uniform layer, and the bonding material enters the recess when the source and support substrates are bonded together. In another embodiment, the recess is formed in the front face of the source substrate, the recess has a depth which extends to near the zone of weakness, and the bonding material is applied onto the front face of the source substrate. In this embodiment, the bonding material in the recess protects the peripheral edge of the transfer layer. Also, the recess is preferably configured to receive bonding material so that the bonding material does not extend past the zone of weakness on outer portions of the source substrate. The recess may be formed through the entire thickness of the source substrate, the support substrate, or both.

The bonding material may be releasable, if desired, so that further modification can be made to the composite structure. Also, the recess can be formed by at least one of wet etching or dry etching or by mechanical machining.

The zone of weakness can be formed by any one of a variety of techniques, including implanting atomic species into the source substrate, providing a porous layer in the source substrate or by providing a releasable bonding interface in the source substrate. When implantation of atomic species is used, the recess can be formed prior to implanting the atomic species.

The invention also relates to a composite substrate comprising a transfer layer, bonding material and the support substrate, wherein the bonding material is present in a recess having a configuration that assists in defining the transfer layer and as a layer that bonds the transfer layer to the support substrate.

BRIEF DESCRIPTION OF THE DRAWINGS

Other characteristics and advantages of the invention will become apparent from the following description of the preferred implementations of the invention, which is made with reference to the accompanying drawings, in which:

FIGS. 1 to 3 are cross-sectional diagrams illustrating the various steps of a prior art method of transferring a layer;

FIGS. 4 to 7 are side, cross-sectional views of substrates illustrating the various steps of a first implementation of a layer transfer method according to the invention;

FIGS. 8 to 11 are side, cross-sectional views of substrates illustrating the various steps of a variant of the first implementation of the method according to the invention shown in FIGS. 4 to 7; and FIG. 12 is a side, cross-sectional view of substrates illustrating a second implementation of the layer transfer method according to the invention.

It should be understood that the various layers, their thicknesses, and/or the recesses formed therein are not shown to scale in the figures. These features have deliberately been enlarged herein for ease of understanding. In addition, like reference numbers in the various figures indicate like components.

DETAILED DESCRIPTION OF THE PREFERRED EMBODIMENTS

The present methods pertain to transferring a layer of material from a source substrate onto a support substrate, to fabricate a composite substrate for applications in the fields of electronics, optics, or optoelectronics. The source substrate includes a zone of weakness interposed between the layer of material to be transferred and the remainder of the source substrate. At least one recess for receiving excess additional material is formed in at least one of the two substrates, wherein the recess opens onto the "front face" of the substrate in which it is formed. Additional material is then deposited onto a front face of the source substrate, or onto the front face of the support substrate, or onto both front faces. Next, the front faces of the source substrate and the support substrate are bonded to each other. Lastly, the layer to be transferred is detached from the remainder of the source substrate along the zone of weakness.

In the remainder of the description, the various described substrates are in the shape of a disk or a cylinder because that is the most common shape. However, it should be understood that the substrates could have other shapes.

FIG. 4 depicts a layer of material 41 that has been derived from a source substrate 4. The layer of material 41 is to be transferred onto a support substrate 5 during the fabrication of a composite substrate. The resulting composite substrate may be used for applications in the fields of electronics, optics, and optoelectronics. The term "composite" means that the substrate has a plurality of layers. In addition, the terms "source substrate" and "support substrate" can encompass both a singular substrate of a given material and a stack of layers of materials which may be of different types.

The source substrate 4 has a cylindrical side face 40, a front face 44, and an opposite, rear face 45. The source substrate 4 also has an internal zone of weakness 43. The term "zone of weakness" generally designates a weak zone of the source substrate 4, and the two layers located on either side thereof will subsequently be detached along this zone of weakness 43.

The zone of weakness 43 can be a zone obtained by implanting atomic species in the source substrate 4. In this case, the zone of weakness 43 is interposed between a layer of material 41 which will subsequently be transferred, and the remainder 42 of the source substrate. The layer 41 and the remainder 42 are formed of the same material. The layer to be transferred 41 extends between the front face 44 and the zone of weakness 43.

When the zone of weakness 43 is obtained by implanting atomic species, implantation occurs from the front face 44 of the source substrate 4. The term "implanting atomic species" means any bombardment of atomic, molecular, or ionic species that is capable of introducing the species into a material at a certain depth below the bombarded surface 44. The maximum concentration of the species is at that depth, and the depth is determined by the implantation energy of the species. Atomic species can be implanted in the source substrate 4, for example, by using an ion beam implanter or a plasma immersion implanter. Implantation is preferably accomplished by ionic bombardment, and the implanted ionic species is preferably hydrogen. Other ionic species can advantageously be used alone or in combination with hydrogen, for example rare gases such as helium.

An example of a transfer process that includes detaching a layer along a zone of weakness is the SMART-CUT® process. This process is described in U.S. Pat. No. 5,374,564, the entire content of which is hereby expressly incorporated herein in its entirety.

A zone of weakness 43 can also be formed by a porous layer obtained, for example, by using the method known under the trade name ELTRAN® registered by Canon, described in U.S. Pat. No. 6,100,166. In this case, the source substrate 4 includes a stack of layers with at least one layer of material 41 obtained by epitaxial growth on a porous layer 43. The porous layer 43 rests on the remainder 42 of the source substrate, wherein the term "remainder" designates a single layer of material.

The zone of weakness 43 can also be a "releasable" bonding interface interposed between the layer 41 and the remainder 42. The remainder 42 may be formed of one or more layers. The term "releasable" means that bonding is not permanent, so that the layer 41 can subsequently be disconnected from the remainder 42.

Referring again to FIG. 4, a support substrate 5 has a cylindrical side face 50, a front face 54, and a rear face 55. The support substrate 5 is used to mechanically hold the assembly together. The front faces 44 and 54 of, respectively, the source substrate 4 and the support substrate 5, are pressed against each other in the subsequent steps of the present method. The present method includes, prior to depositing any material, forming at least one recess opening on the front face of at least one of the two substrates 4 and 5 (or both). As shown in the figures, this recess collects any excess material 6 that is deposited between the respective front faces 44 and 54 of the two substrates 4 and 5.

In a first implementation of the present technique shown in FIGS. 4 to 7, the recess 56 is formed in the support substrate 5 and opens outwardly into the front face 54. The recess 56 can be of any shape, but may advantageously be in the shape of an annular groove located close to the periphery of the substrate 5. The dimensions of the recess 56, i.e., its width, length and depth, can be selected by the skilled person depending on the amount of excess volume of material 6 that it will be able to receive. The recess 56 creates a buffer space that collects any excess material 6. Different variable factors may contribute to the fact that the volume of additional material 6 cannot be accurately reproduced from one substrate to another. The size of the recess 56 will thus generally correspond to about 10% to 20% of the total volume of additional material 6.

If a constant volume of material 6 is deposited from one substrate to another (by using a syringe, for example), the present technique makes it possible to introduce successive substrates having slightly varying diameters into the fabrication facility without having to modify the volume of material 6 that is deposited.

The recess 56 can be formed in a variety of ways and in particular by methods known as "cold methods", which are those methods carried out at a temperature of less than about 400° C. The recess can also be formed by "hot methods", which are methods that heat the substrate to temperatures of more than 400° C., but with the heating being localized to the region in which etching occurs.

Cold methods include wet etching and dry etching. Wet etching consists of applying a mask to the front face 54 of the support substrate 5. The mask may be obtained by photolithography and includes the pattern of the recess 56 which is to be reproduced. For example, the mask can be produced using a photosensitive resin, a layer of silicon dioxide ($SiO_2$), or a layer of silicon nitride ($Si_3N_4$). The prepared substrate is then immersed in an etching solution having a suitable chemical solution kept at a temperature of close to 70° C., while the rear face 55 is protected from the solution. This etching solution selectively attacks the unprotected portion of the front face 54 and etches the recess 56. The etching solution contacts the substrate 5 for a predetermined duration which determines the etching depth. For example, a mask can be formed from $SiO_2$ or $Si_3N_4$ to place on a layer of silicon, and then either potassium hydroxide (KOH) or tetramethyl hydroxylamine (TMAH) can be used to etch the silicon. These two chemical solutions exhibit very great selectivity between silicon and $SiO_2$ or $Si_3N_4$. Following etching, the mask must be removed. It is possible to use a solvent when the mask is based on a resin, for example, or to use a solution of hydrofluoric acid (HF) for a $SiO_2$ mask, or to use phosphoric acid ($H_3PO_4$) at 180° C. for a $Si_3N_4$ mask.

Dry etching may also be carried out through a mask applied to the front face 54 of the substrate 5. The mask can be produced as described above for wet etching. Dry etching could then be accomplished by ionic bombardment, which combines the ballistic action of ions with their chemical action.

One example of a method used for dry etching is the "RIE" method, which is air acronym for "reactive ion etching". The chemical compounds used for the bombardment depend strongly on the chemical nature of the layer to be etched. For example, silicon may be etched with sulfur hexafluoride $SF_6$, silicon carbide may be etched with a mixture of sulfur hexafluoride and oxygen ($SF_6/O_2$), silicon oxide may be etched with a mixture of sulfur hexafluoride and oxygen ($SF_6/O_2$) or with a mixture of trifluoromethane and sulfur hexafluoride ($CHF_3/SF_6$), and silicon nitride can be etched using a trifluoromethane/oxygen/sulfur hexafluoride mixture ($CHF_3/O_2/SF_6$).

Etching can vary as a function of different parameters, such as an applied voltage, or the pressure inside the vessel in which the particular etching method is used. In contrast to wet etching, it is not necessary to protect the rear face of the substrate prior to etching. Such a technique is known as monoface etching. The mask is then removed as described above.

Hot methods may include mechanical machining, for example, by using a saw or a laser. The advantage of this type of technique is that there is no need to protect either the front face or the rear face of the substrate.

Mechanical machining can be carried out using a saw, made of, for example, silicon carbide, which can produce grooves of about 100 micrometers ($\mu$m). A laser beam could also be used to heat the material until it melts. Such a technique allows machining to be automated and allows a series of cut segments to be formed. However, the molten material often tends to re-deposit itself on the sides of the structure, forming beads which then have to be removed by chemical attack. Thus, any active zones on the substrate should be protected.

Referring to FIG. 5, after the recess 56 has been formed, a material 6 is deposited either on the front face 44 of the source substrate 4 (as shown in FIG. 5), or on the front face 54 of the support substrate 5, or on both front faces. In the last two cases, material 6 is deposited only after the recess 56 has been formed.

The bonding material 6 is preferably an adhesive (for example an epoxy adhesive or a cyanoacrylate adhesive) or an adhesive compound, such as a liquid or solid compound. The material 6 can be applied to or deposited onto substrates 4 or 5 to allow them to adhere to each other. Examples of suitable adhesive compounds include polyimides, wax or a product known as "SOG" (spin on glass), which is a liquid oxide deposited by a centrifuge.

As shown in FIG. 6, the two substrates are then pressed against each other so that the layer of material 6 is between the front faces 44 and 54 such that the two substrates 4 and 5 are bonded to each other. Any excess material 6 penetrates into the recess 56, which prevents excess material 6 from projecting outwardly in the direction of the side faces 40 and 50. Thus, excess material does not cover the peripheral edge of the zone of weakness 43. Finally, in FIG. 7 a mechanical stress is applied so that the layer to be transferred 41 detaches from the remainder 42 of the source substrate 4 along the zone of weakness 43. The stress may be a tension and/or a bending and/or a shear stress, for example. The stress may be applied, for example, by a pulling rig, by a blade such as a guillotine contacting the side face 40 of the source substrate 4 at the zone of weakness 43, or by a jet of fluid (liquid or gas) applied laterally to the zone of weakness 43. Detachment takes place horizontally along the zone of weakness 43 and vertically, that is perpendicular to, or substantially perpendicular to, the outer limit of the layer of material 6. Reference can be made to French patent FR-A-2 796 491 and U.S. Pat. No. 6,100,166, which describe methods of detaching two layers using a jet of gas (air) and a jet of liquid (water), respectively.

A second variant of the present method is illustrated in FIGS. 8 to 11. A recess 46 for receiving any excess of material 6 is formed on the front face 44 of the source substrate 4. Apart from the position of the recess, the successive steps of the method shown in these figures are similar to those of FIGS. 4 to 7, and thus their description will not be repeated here in detail. However, in this particular case, a laser should not be used to form the recess 46 since metallic layers, for example, or a weakened layer obtained by implanting atomic species, may be incapable of tolerating the localized heating caused by the laser. Further, if machining is carried out by a hot method (mechanical machining) and if the zone of weakness 43 is obtained by implanting atomic species, then the recess 46 should be formed prior to the atomic species implantation step. This precaution will prevent the localized elevated temperature caused by the machining from causing the layer 41 to detach prematurely from the remainder 42 of substrate 4. Further, when the front face 44 is a "processed" surface, etching should be carried out in the cut paths (the inactive zones on the front face 44) to limit the loss of surface area. It should also be noted that the depth of the recess 46 is at least equal to the depth at which the zone of weakness 43 is located (which corresponds to the thickness of the layer to be transferred 41). Finally, it is also possible to simultaneously provide recesses 46 and 56 on the two front faces of substrates 4 and 6, respectively. Such a configuration further increases the available capacity to collect any excess amount of the material 6.

FIG. 12 shows a second embodiment that includes recesses for receiving an excess amount of material 6. In FIG. 12, the source substrate 4 and the support substrate 5 are shown bonded together. In this embodiment, the recess formed in one substrate communicates with the rear face thereof via a channel. In order to simplify the diagrams, a first variant of the channel has been arbitrarily selected to be shown on the support substrate 5, and a second variant is shown on the source substrate 4. It should be understood that the channels could be reversed, and that other configurations are contemplated.

In the first variant, a recess 56 communicates with the rear face 55 of substrate 5 via a channel 57. The channel 57 can have any shape and connects the recess of the front face 54 to the rear face 55. In the second variant, the recess is the channel 47 that passes through the source substrate 4 from one side to the other. As explained above, it is also possible to have both recesses and channels in the source substrate 4 and in the support substrate 5. The channels 47 and 57 are formed using the same techniques used for forming the recesses 46 and 56, and preferably use wet or dry etching techniques, which result in deep etched channels. The channels 47 or 57 allows the excess of material 6 to be evacuated from the rear faces 45 and 55 of the substrates. Since the channels are open to the outside, such a configuration allows greater variation in the volume of applied material 6.

The present methods are suitable for substrates 4 and 5 of a variety of materials, in particular semiconductors that can be used in the fields of optics, electronics, and optoelectronics. Examples of suitable substrate materials include, but are not limited to, silicon, germanium, silicon carbide (SiC), or III–V materials, which are compounds having at least one element found in column IIIa of the periodic table and the other element found in column Va, for example gallium arsenide (GaAs), or indium phosphide (InP).

What is claimed is:

1. A method for fabricating a composite substrate which method comprises:
    forming a recess in a front face of at least one of a support substrate or a source substrate that extends to a zone of weakness, the recess having a configuration that, in conjunction with the zone of weakness, assists in defining a transfer layer in the source substrate;
    depositing a bonding material onto at least one of the front face of the source substrate or the front face of the support substrate;
    bonding the front faces of the source and support substrates together in a manner to provide at least some of the bonding material in the recess; and mechanically or thermally detaching the transfer layer from the source substrate along the zone of weakness to form a composite substrate comprising the transfer layer, bonding material and the support substrate.

2. The method of claim 1 wherein transfer layer has a periphery and the configuration of the recess corresponds to the periphery of the transfer layer.

3. The method of claim 2 wherein the transfer layer periphery and recess are circular.

4. The method of claim 2 wherein the recess comprises a groove or channel.

5. The method of claim 2 wherein the recess is formed in the front face of the support substrate, the bonding material is deposited onto the front face of the source substrate as a uniform layer, and the bonding material enters the recess when the source and support substrates are bonded together.

6. The method of claim 2 wherein the recess is formed in the front face of the source substrate, the recess has a depth which extends to near the zone of weakness, and the bonding material is applied onto the front face of the source substrate.

7. The method of claim 6 wherein the recess is configured to receive bonding material so that the bonding material does not extend past the zone of weakness on outer portions of the source substrate.

8. The method of claim 6 wherein the bonding material in the recess protects the peripheral edge of the transfer layer.

9. The method of claim 1 wherein the recess is formed through the entire thickness of the source substrate or the support substrate.

10. The method of claim 1 wherein recesses are formed through the entire thickness of both the source substrate and the support substrate.

11. The method of claim 1 wherein the bonding material is releasable.

12. The method of claim 1 wherein the recess is formed by at least one of wet etching or dry etching.

13. The method of claim 1 wherein the recess is formed by mechanical machining.

14. The method of claim 13 wherein the mechanical machining is conducted using at least one of a saw or a laser beam.

15. The method of claim 1 which further comprises implanting atomic species into the source substrate to form the zone of weakness.

16. The method of claim 15 which further comprises fanning the recess in the source substrate prior to implanting the atomic species.

17. The method of claim 1 which further comprises providing a porous layer in the source substrate to form the zone of weakness.

18. The method of claim 1 which further comprises providing a releasable bonding interface to form the zone of weakness.

19. The method of claim 1 wherein the transfer layer is detached by applying a mechanical stress to the zone of weakness.

20. The method of claim 19 wherein the mechanical stress includes at least one of a tension, a bending stress or a shear stress.

21. The method of claim 1 wherein the transfer layer comprises a semiconductor material.

22. The method of claim 1 wherein the bonding material comprises an adhesive or adhesive material.

* * * * *

UNITED STATES PATENT AND TRADEMARK OFFICE
CERTIFICATE OF CORRECTION

PATENT NO. : 6,913,971 B2
DATED : July 5, 2005
INVENTOR(S) : Aspar et al.

It is certified that error appears in the above-identified patent and that said Letters Patent is hereby corrected as shown below:

Column 8,
Line 41, before "the recess in the source substrate prior to implanting" delete "fanning" and insert -- forming --.

Signed and Sealed this

Twenty-third Day of August, 2005

JON W. DUDAS
*Director of the United States Patent and Trademark Office*